(12) United States Patent
Kijima

(10) Patent No.: US 6,567,594 B2
(45) Date of Patent: *May 20, 2003

(54) OPTICAL DEVICE AND BASE FOR OPTICAL DEVICE

(75) Inventor: Yasunori Kijima, Tokyo (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/516,113

(22) Filed: Mar. 1, 2000

(65) Prior Publication Data

US 2002/0122642 A1 Sep. 5, 2002

(30) Foreign Application Priority Data

Mar. 5, 1999 (JP) ............................................. 11-058050

(51) Int. Cl.⁷ .................................................. G02B 6/04
(52) U.S. Cl. ....................... 385/120; 385/43; 385/116; 385/121; 385/901
(58) Field of Search ......................... 385/120, 16, 901, 385/121, 115, 116, 147, 43

(56) References Cited

U.S. PATENT DOCUMENTS

| | | | | |
|---|---|---|---|---|
| 3,853,658 A | * | 12/1974 | Ney | ............................ 156/180 |
| 4,299,447 A | * | 11/1981 | Soltan et al. | .......... 340/815.42 |
| 4,558,255 A | * | 12/1985 | Genovese et al. | .......... 313/497 |
| 4,613,210 A | * | 9/1986 | Pollard | ..................... 358/901.1 |
| 5,131,065 A | * | 7/1992 | Briggs et al. | ................ 385/120 |
| 5,457,565 A | * | 10/1995 | Namiki et al. | ............... 359/273 |
| 5,465,315 A | * | 11/1995 | Sakai et al. | .................. 385/116 |
| 5,481,385 A | * | 1/1996 | Zimmerman et al. | ......... 349/62 |
| 5,655,043 A | * | 8/1997 | Davies et al. | ................ 385/119 |
| 5,818,998 A | * | 10/1998 | Harris et al. | ................ 385/901 |
| 5,932,964 A | * | 8/1999 | McCann et al. | ............. 313/498 |
| 5,969,343 A | * | 10/1999 | Nakamura et al. | ...... 250/227.31 |
| 6,160,606 A | * | 12/2000 | Sprague | ...................... 349/159 |

* cited by examiner

*Primary Examiner*—Hemang Sanghavi
*Assistant Examiner*—Scott A Knauss
(74) *Attorney, Agent, or Firm*—Sonnenschein, Nath & Rosenthal

(57) ABSTRACT

Disclosed herein are an optical device and a base used for the optical device, the optical device of the present invention comprising a light transmittable base and a device constituent layer provided on the base, wherein the base includes, at least in a pixel formation region, continuously extending layers arranged to exhibit a cyclic refractive index distribution in the in-plane direction and to exhibit a specific refractive index in the thickness direction, and the base, on the device constituent layer side, has a surface roughness of 300 nm or less. Accordingly, the optical device having a long service life which is capable of extracting luminescence generated in an organic EL device from a light transmittable substrate to the external and of obtaining a high luminance even under low voltage drive and a base used for the optical device are achieved.

20 Claims, 8 Drawing Sheets

STRUCTURAL FORMULA
OF m-MTDATA

STRUCTURAL FORMULA
OF α-NPD

STRUCTURAL FORMULA
OF Alq$_3$

OPTICAL DEVICE AND BASE FOR OPTICAL DEVICE

RELATED APPLICATION DATA

This application claims priority to Japanese Patent Application No. P11-058050, filed Mar. 5, 1999.

BACKGROUND OF THE INVENTION

The present invention relates to an optical device, for example, suitable for a flat display for extracting light generated in a light emission portion from a substrate to the external, more particularly to an optical device suitable for an organic electroluminescence display using an organic thin film as an electroluminescence layer, and also relates to a base for the optical device.

Recently, interfaces between human being and machines, for example, multi-media oriented articles have become increasingly important. In order for a user to more comfortably, efficiently operate a machine, it is required for the user to nonerroneously, simply, instantly take a sufficient amount of information out of the machine. To meet such a requirement, studies have been made to develop various display devices.

With the miniaturization of machines, display devices concerned therewith have been also increasingly required to be miniaturized and thinned.

For example, the miniaturization of so-called a laptop-type information processing equipment, that is, display device incorporating type information processing equipment, such as a note-type personal computer or a note-type word processor, has significantly advanced, and correspondingly, the technique regarding the liquid crystal displays as the display devices used for the laptop type information processing equipment has been significantly innovated.

Nowadays, liquid crystal displays have been used as interfaces for various articles used in our daily life, for example, needless to say, laptop-type information equipment, small-sized TV sets, watches, and electronic calculators.

The liquid crystal display having a feature of the liquid crystal which is driven at a low voltage, that is, at a low power consumption, has been studied as a primary display device to be used in various interfaces between human being and machines, that is, various display devices ranging from a small-sized display device to a large capacity display device.

The liquid crystal display, however, has no spontaneous luminescence, and therefore, it requires a backlight. The drive of the backlight requires a power larger than a power for driving liquid crystal. As a result, the liquid crystal display has such a limitation in use that the service time is short insofar as the device is driven by a self-contained battery.

The liquid crystal display has another problem that it is not suitable to be used as a large-sized display device because of its narrow viewing angle, and has a further problem that the contrast varies depending on the viewing angle even if the angle is within a specific viewing angle, because of the display mechanism utilizing the orientation state of liquid crystal molecules.

The liquid crystal display also has an inconvenience caused by its drive mode. For example, an active matrix mode as one of the drive modes of the liquid crystal display exhibits a large response speed enough to handle a moving picture, however, since such a mode adopts a TFT drive circuit, it fails to enlarge the screen size because of a pixel failure. The use of the TFT drive circuit is also undesirable in terms of cost reduction.

A simple matrix mode as another drive mode of the liquid crystal display is low in cost and relatively easy in enlargement of the screen size, however, it does not exhibit a response speed enough to handle a moving picture.

On the other hand, studies have been made to develop spontaneous light emission devices such as a plasma display device, an inorganic electroluminescence device, and an organic electroluminescence device.

The plasma display device utilizes plasma emission in a low pressure gas as a display means, and therefore, it is adapted to enlarge the screen size and to increase the capacity, however, it has problems in terms of thinning and cost. Further, the plasma display device is not suitable to be used as a portable device because a high voltage DC bias must be applied for driving the plasma display device.

As the inorganic electroluminescence device, a green color luminescence display has been commercialized, however, since such a device is driven with a DC bias like the plasma display device, it requires a large drive voltage of several hundreds V. Further, it is apparently difficult to develop a full-color inorganic electroluminescence display.

On the other hand, an organic electroluminescence phenomenon has been studied for a long time since a luminescence phenomenon caused by injecting carriers in an anthracene single crystal having a feature of strongly generating fluorescence had been found in the early 1960s, however, on the basis of the facts that the luminance has been low, luminescence of only single color has been found, and luminescence has been generated by injecting carriers to a single crystal, the studies have been continued as basic studies regarding injection of carries in organic materials.

However, in 1987, Mr. Tang and others of Eastman Kodak Company announced an organic thin film electroluminescence device of a laminated structure having an amorphous luminescence layer enabling low voltage drive and luminescence with a high luminance, and since then studies and developments have been extensively made regarding luminescence of three primary colors, R (red), G (green), and B (blue), stability, rise in luminance, laminated structure, production method, etc.

Along with development of new organic materials by molecular design or the like, studies have been extensively made to apply innovative organic electroluminescence display devices having excellent features such as low DC voltage drive, thinner, spontaneous luminescence, to color displays.

The organic electroluminescence device (hereinafter, referred to sometimes as "organic EL device") has an ideal feature as a spontaneous luminescence type display device, which converts an electric energy caused by injection of a current into an optical energy for exhibiting planar luminescence.

FIG. 13 shows one example of a related art organic EL device 10. The organic EL device 10 is produced by sequentially forming, on a transparent substrate (for example, glass substrate) 6, an ITO (Indium Tin Oxide) transparent electrode 5, a hole transfer layer 4, a luminescence layer 3, an electron transfer layer 2, and a cathode (for example, aluminum electrode) 1 by a vacuum vapor-deposition method.

When a DC voltage 7 is applied between the transparent electrode 4 serving as an anode and the cathode 1, holes as carriers injected from the transparent electrode 5 reach the luminescence layer 3 through the hole transfer layer 4 while electrons injected from the cathode 1 also reach the luminescence layer 3 through the electron transfer layer 2, to cause recombination of the electrons and the holes in the luminescence layer 3. As a result, luminescence 8 having a specific wavelength occurs by the above recombination of the electrons and holes, which is visible from the transparent substrate 6 side.

The luminescence layer 3 may be made from one or more kinds of luminescent materials selected from anthracene, naphthalene, phenanthrene, pyrene, chrysene, perilene, butadiene, coumarin, acridine, and stilbene. A mixture with such a luminescent material may be contained in the electron transfer layer 2.

FIG. 14 shows an another related art organic EL device 10A, in which the luminescence layer 3 is omitted but instead a mixture with the above luminescent material is contained in the electron transfer layer 2, whereby luminescence 8 having a specific wavelength is generated from an interface between the electron transfer layer 2 and the hole transfer layer 4.

FIG. 15 shows an application example of the above organic EL device, in which a laminated body of organic layers (a hole transfer layer 4 and a luminescence layer 3 or an electron transfer layer 2) is disposed between the stripe cathodes 1 and the stripe anodes 5 which cross each other in a form of a matrix, and signal voltages are applied therebetween in a time-series manner by a luminance signal circuit 11 and a shift register incorporating control circuit 12, whereby luminescence occurs at a plurality of crossing points (pixels).

Accordingly, the organic EL device having the above configuration can be used not only as a display but also as a picture reproducing device. In addition, the organic EL device can be configured as a full-color or multicolor organic EL device by arranging the above-described stripe patterns for each of three-primary colors, red (R), green (G), and blue (B).

Where using such an organic EL display device for a display unit composed of a plurality of pixels, the organic thin layers 2, 3 and 4 are held between the transparent electrode 5 and the metal electrode 1, wherein luminescence is extracted on the transparent electrode 5 side. Such a related art organic EL display device has plenty of room for improvement.

In the case of applying a luminescence device to a color display, stable luminescence with a high efficiency is essential, however, even the luminescence device having the optimum structure exhibits a light extraction efficiency of about 20% only, and most of luminescence is dissipated or scattered on the side surface of the base due to total reflection from the interface between the device and the base. As a result, the device is required to be driven at a high voltage for obtaining high enough luminance. Such high voltage drive may cause deterioration of the device.

This means that, even if a luminescence device is improved in luminous efficiency by combination of organic materials newly developed, unless the light extraction efficiency is improved, the stress of the device becomes large to shorten the service life of the device.

SUMMARY OF THE INVENTION

An object of the present invention is to provide an optical device having a long service life, which is capable of extracting light generated in a light emission portion, more specifically, luminescence generated in an electroluminescence device to the external through a light transmittable base at a high efficiency, and of obtaining a high luminance even under low voltage drive or low light quantity, and to provide a base used for the optical device.

To achieve the above object, according to a first aspect of the present invention, there is provided an optical device including: a light transmittable base; and a device constituent layer provided on the base; wherein the base includes, at least in a pixel formation region, continuously extending layers arranged to exhibit a cyclic refractive index distribution in the in-plane direction and to exhibit a specific refractive index in the thickness direction; and the base, on the device constituent layer side, has a surface roughness of 300 nm or less.

The optical device of the present invention is configured such that the base includes, at least in a pixel formation region, continuously extending layers arranged to exhibit a cyclic refractive index distribution in the in-plane direction and to exhibit a specific refractive index in the thickness direction, and the base, on the device constituent layer side, has a surface roughness of 300 nm or less, and therefore, the optical device exhibits the following features. The features will be described by example of using an optical guide such as an aggregation of optical fibers as the base. First, in the thickness direction of the base, light generated in the light emission portion is impinged on each continuously extending layer (optical fiber) at an incident angle within a critical angle defining the total reflection, and passes through the continuously extending layer while being efficiently guided in a state being confined in the optical fiber. Next, in the in-plane direction of the base, since the continuously extending layer, or optical fibers are arranged at specific intervals to exhibit the above cyclic refractive index distribution and further the surface of the base is finished into a surface roughness of 300 nm or less, a sufficient and uniform quality of the incident light passes, at least in the pixel formation region, through the aggregation of optical fibers in a state with less irregular reflection or scattering, and is emerged from the aggregation of the optical fibers. As a result, the quantity of the incident light escaped to the side surface of the base is significantly reduced, and therefore, the efficiency of extracting the incident light to the external as transmission light while keeping a sufficient transmission quantity or a sufficient intensity is increased. The optical device of the present invention, therefore, exhibits a high luminance even under low voltage drive or low light quantity.

According to another aspect of the present invention, there is provided a base for an optical device, which is light transmittable and on which an optical device constituent layer is provided, the base including: continuously extending layers arranged to exhibit a cyclic refractive index distribution in the in-plane direction and to exhibit a specific refractive index in the thickness direction; wherein the surface roughness of the base on the device constituent layer side is in a range of 300 nm or less.

According to the base of the present invention, it is possible to allow the above-described optical device provided on the base to exhibit the above-described effects.

DESCRIPTION OF THE PREFERRED EMBODIMENTS

Hereinafter, preferred embodiments of the present invention will be described with reference to the accompanying drawings.

Figure 1:
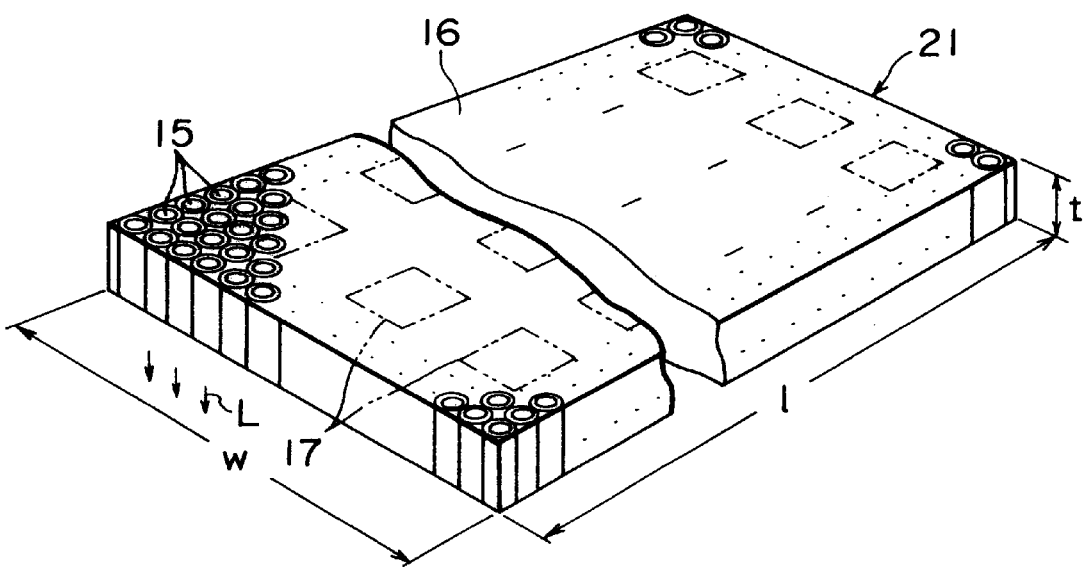
FIG. 1 is a schematic perspective view showing a base for an organic EL device according to an embodiment of the present invention.

FIG. 1 shows an optical device and a base for the optical device according to the present invention. As shown in FIG. 1, a base 21 is composed of an aggregation of optical fibers 15 shown in FIG. 2. The optical fibers 15 of the above aggregation are desirably to be arranged along the thickness "t" direction of the base 21. In addition, since only those of the optical fibers 15 in pixel regions 17 of the base 21 are effective, the optical fibers 15 are sufficient to be provided only in the pixel regions 17, for example, only in the pixel regions 17 of a glass base shown in FIG. 4. In each case, the optical fibers, each of which is composed of a core having a large refractive index and a clad having a small refractive index, are arranged in the thickness direction of the base, the base composed of the optical fibers has, in the in-plane direction perpendicular to the thickness direction, a cyclic refractive index distribution formed by repetition of the cores having the large refractive indexes and the clads having the small refractive indexes.

Figure 3:
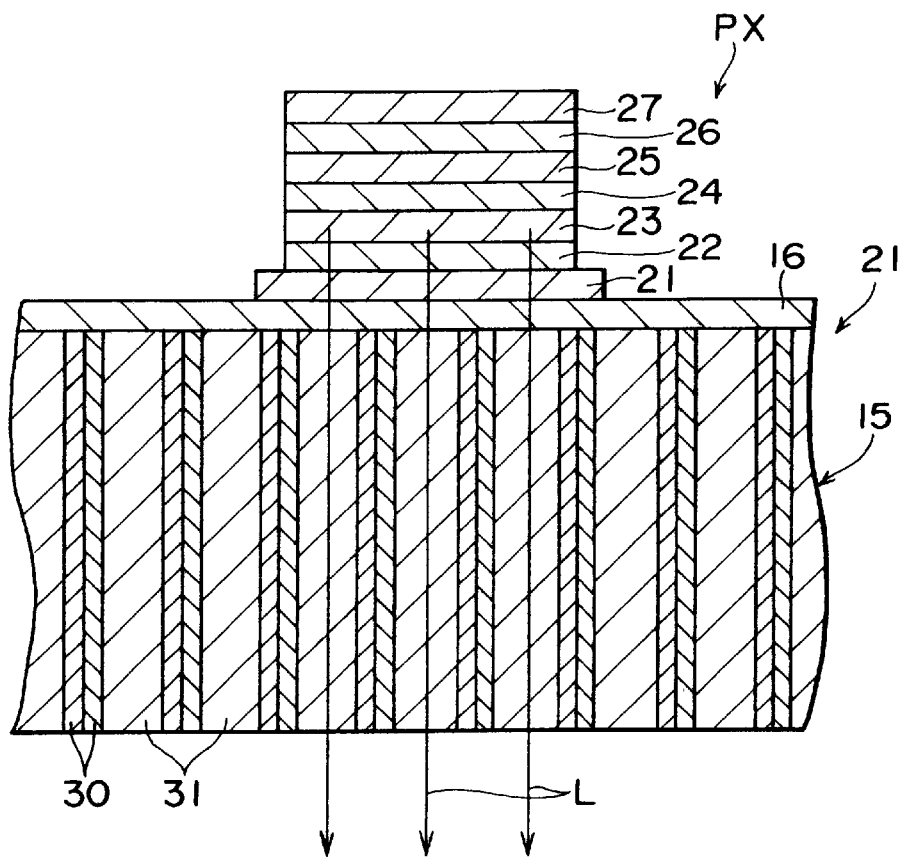
FIG. 3 is an enlarged sectional view of a pixel region and its neighborhood of the organic EL device shown in FIG. 1.

In addition to the above configuration of the base 21 in which the optical fibers 15 are arranged to exhibit the cyclic refractive index distribution in the in-plane direction, the base 21 is also configured that the surface roughness thereof is made as small as 300 nm or less. With these configurations, as shown in FIG. 3, with respect to light emitted from a pixel PX formed on the base 21, the light quantity dissipated by irregular reflection from the interface between the pixel PX and the base 21 is significantly reduced, so that the incident light impinged on the optical fiber can be efficiently extracted from the base 21 as transmission light L.

Figure 2:
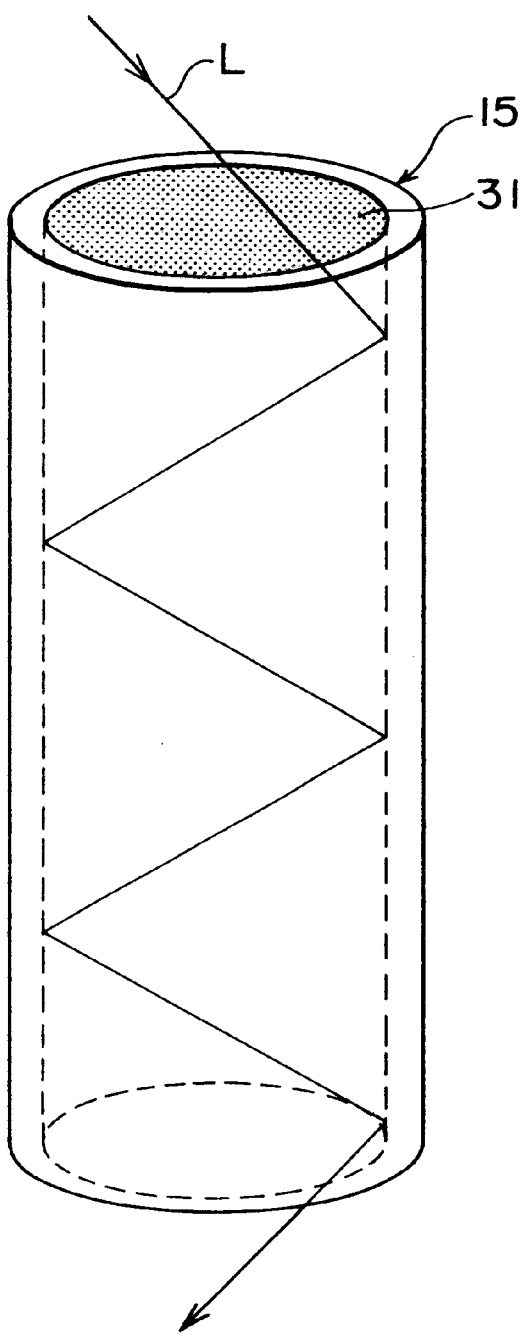
FIG. 2 is an enlarged perspective view of one of optical fibers constituting the base shown in FIG. 1.

FIG. 2 shows light which passes through the optical fiber 15 while being totally reflected from the inner wall of the optical fiber 15. To be more specific, light L impinged on a core 31 at an incident angle within a specific critical angle is reflected from the interface between the core 31 having a large refractive index and a clad 30 having a smaller refractive index, and passes through the core 31 while being totally reflected from the above interface.

The base in this embodiment has a cyclic refractive index distribution in the in-plane direction as described above, however, such a characteristic of the base is not limited to the magnitude, cycle and pattern of the refractive index varied depending on the kind and grade of the optical fiber 15.

The base in this embodiment has continuously extending layers arranged to exhibit a specific refractive index in the thickness direction of the base; such a characteristic of the base is not limited to the magnitude and pattern of the refractive index. For example, each of the optical fibers of the base may be formed into patterns, such as a circular or square truncated shape in which the light incoming area is small and the light outgoing area is large. The use of the optical fibers having such a shape pattern is effective to enlargedly display a small luminescent area.

Figure 5:
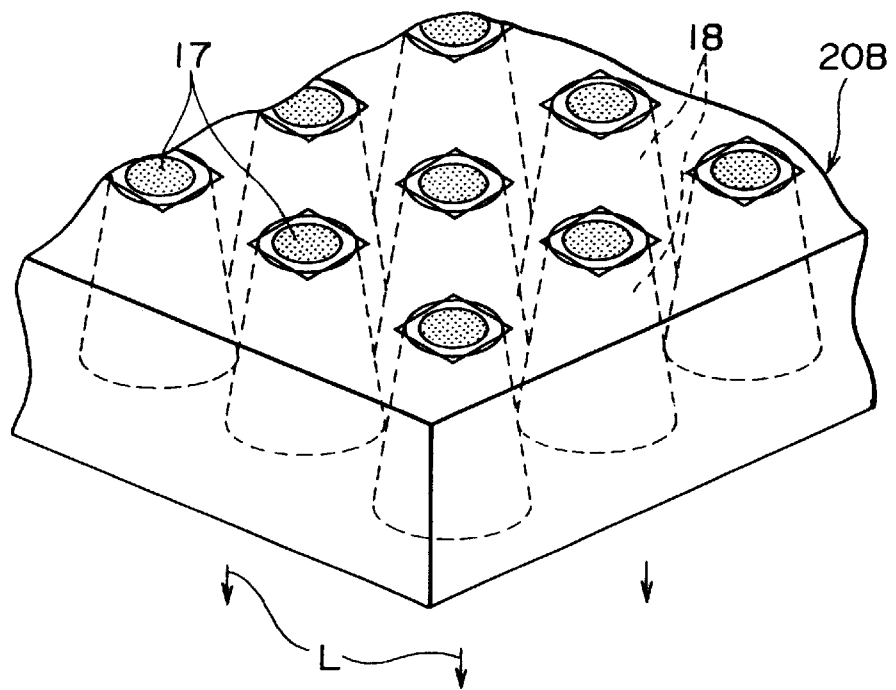
FIG. 5 is a schematic view of another variation of the base.
Figure 6A:
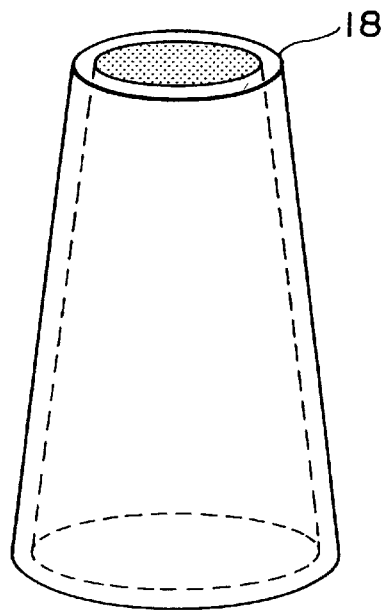
FIG. 6A is a perspective view showing a variation of the fiber configuration, in which a circular truncated fiber is provided in each pixel region.
Figure 7:
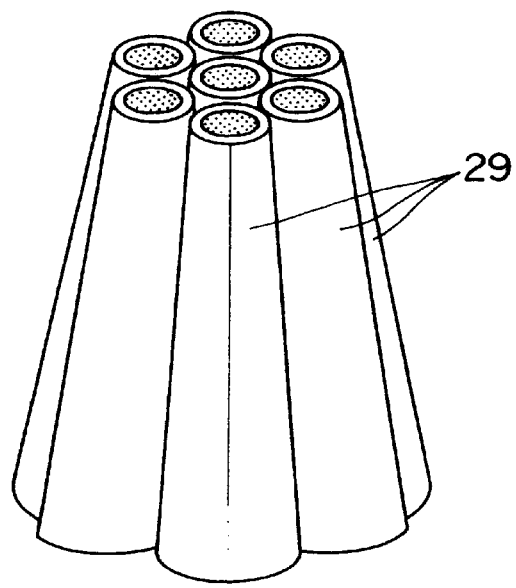
FIG. 7 is a perspective view showing a further variation of the fiber configuration, in which a plurality of elongated circular truncated fibers are provided in each pixel region.

For example, as shown in FIG. 5, a circular truncated optical fiber 18 shown in FIG. 6A or a square truncated optical fiber 19 may be provided in each of pixel regions 17 of a base 20B, or a plurality of elongated circular truncated optical fibers 29 shown in FIG. 7 may be provided in each of the above pixel regions 17. The shape of such an optical fiber may turned over in the vertical direction such that the light outgoing region is reduced.

The optical fibers may be preferably configured as quartz glass fibers or polymer fibers. The base shown in FIG. 1 may be preferably obtained by adhesively bonding the optical fibers configured as quartz glass fibers or polymer fibers to each other with an adhesive made from typically an ultraviolet curing resin, and cutting an aggregation of the optical fibers in the direction crossing the fiber length direction.

The base having a cyclic refractive index distribution in the in-plane direction and a continuous refractive index in the thickness direction can be generally obtained, typically, by thinly cutting an aggregation of quartz glass fibers or polymer fibers, however, since each optical fiber is composed of a fiber central portion (core) and a fiber peripheral portion (clad or its outer peripheral portion) made from different materials, the surface roughness of the base becomes about 2 µm even if the cut surface of the base is polished.

Accordingly, to extract transmission light at a higher efficiency, it is desirable that after the base is obtained by cutting the aggregation of the optical fibers, an organic or inorganic layer, designated by reference numeral 16 of FIG. 3, be formed on the entire in-plane of the base, making the surface roughness of the base 300 nm or less, preferably, several nm.

In this case, by carefully polishing the surface of the base after the base is obtained by cutting the aggregation of the optical fibers, the surface roughness of the base can be reduced to about 500 nm, however, since the thickness of a transparent electrode to be formed on the base at the subsequent step is generally in a range of 100 to 300 nm, the surface roughness of the base is not negligible, that is, exerts adverse effect on the surface roughness of the transparent electrode, with a result that the surface roughness of the transparent electrode becomes large.

The large surface roughness of the transparent electrode is disadvantageous in making large the frequency of initial dark spots caused upon preparation of the organic EL device or causing short-circuit or the like, thereby making it difficult to obtain the device capable of keeping a stable performance for a long period of time.

As a result, the organic or inorganic layer formed to cover the polished surface of the base after the base is obtained by cutting the aggregation of optical fibers may be preferably polished such that the surface roughness is in a range of 300 nm or less.

To suitably perform the above-described surface polishing, an ultraviolet curing resin generally used for adhesive bonding of an optical lens may be preferably used as an organic adhesive for adhesively bonding the optical fibers to each other, and frit glass may be preferably used as an inorganic adhesive for adhesively bonding the optical fibers to each other.

The base in this embodiment is configured such that the entire in-plane of the base is covered with an organic or inorganic material for improving the surface roughness, however, the kind of the organic or inorganic material is not limited insofar as the material has a desirable surface characteristic to be easily finished into a small surface roughness.

The surface polishing may be performed after the entire in-plane of the base is covered with an organic or inorganic material; and further, a base having a desirable surface characteristic such as a glass base may be adhesively bonded to the organic or inorganic layer formed on the entire in-plane of the base.

Figure 13:
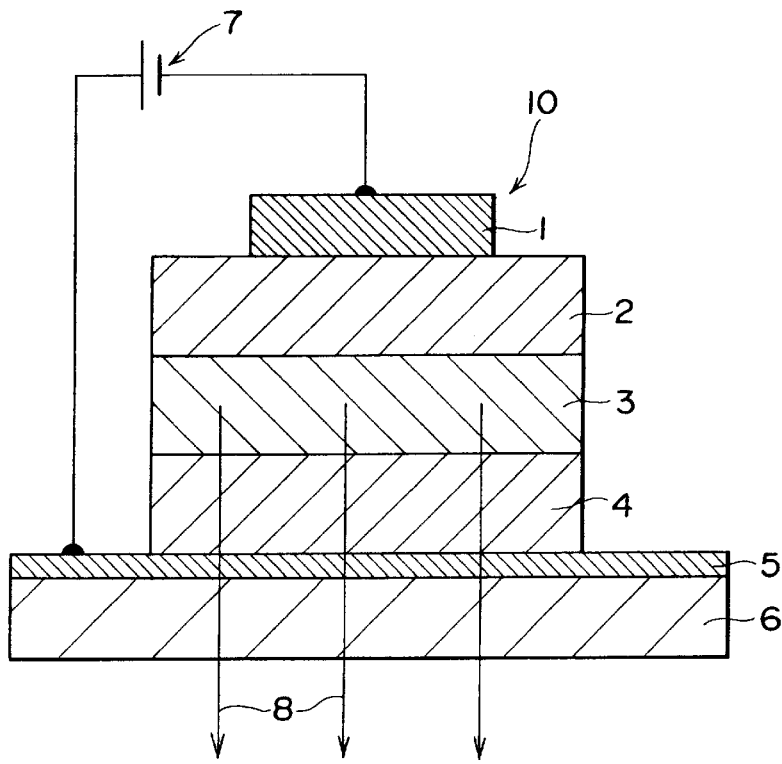
FIG. 13 is a schematic sectional view showing one example of a related art organic EL device.
Figure 14:
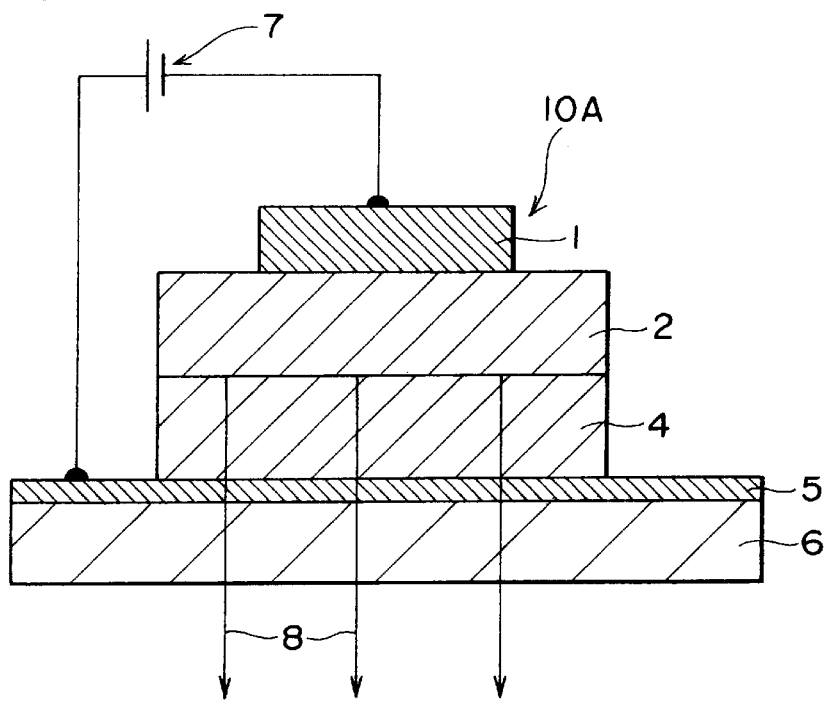
FIG. 14 is a schematic sectional view showing another example of the related art organic EL device.
Figure 15:
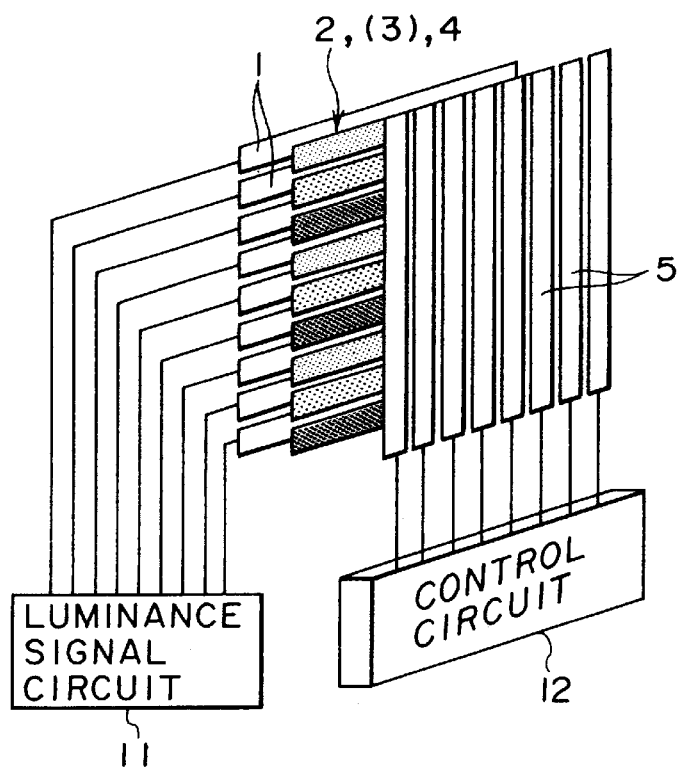
FIG. 15 is a schematic sectional view showing an application example of the related art organic EL device.

The base in this embodiment as described above is suitable for formation of a laminated body of organic layers including a luminescence region on the base. For example, as described above with reference to FIG. 13, the optical transparent electrode 5, the organic positive hole transfer layer 4, the organic luminescence layer 3 and/or the organic electron transfer layer 2, and metal electrode 1 are sequentially laminated on the base 6, to obtain a desirable organic electroluminescence device.

Figure 8:
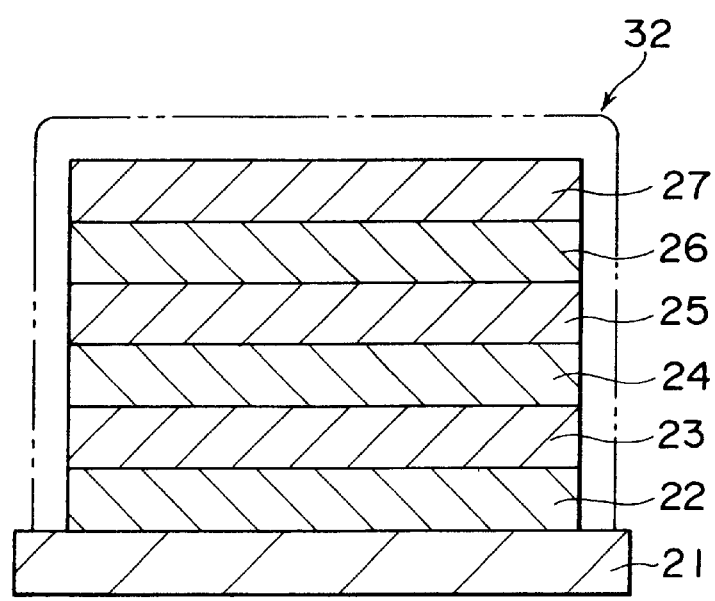
FIG. 8 is a schematic sectional view showing an organic EL device according to this embodiment.

Further, as shown in FIG. 8, an ITO anode electrode 22, a positive hole injection layer 23, a positive hole transfer layer 24, a luminescence layer 25, an electron transfer layer 26, and a cathode electrode 27 may be formed on a base 21.

In the case of forming an organic electroluminescence device by using the above-described base, the constituent materials of the device are not limited. For example, the positive hole transfer layer 24 may be made from a positive hole transfer material such as a benzidine derivative, a styrylamine derivative, triphenylmethane derivative or a hydrazone derivative.

Each of the ITO anode electrode 22, the positive hole injection layer 23, the positive hole transfer layer 24, the luminescence layer 25, the electron transfer layer 26, and the cathode electrode 27 may be of a laminated structure of a plurality of layers.

To control the spectrum of luminescence generated in the luminescence layer 25, a trace of molecules may be co-vapor deposited. For example, the luminescence layer 5 may be formed of an organic thin film containing a trace of an organic material such as a perilene derivative, a coumarine derivative, or a pyran based pigment.

The cathode electrode 27 may be made from a metal having a small work function from a vacuum level for effectively injecting electrons in the cathode electrode 27. For example, a single metal having a small wok function such as In, Mg, Ag, Ca, Ba or Li may be used as the above electrode material, or to enhance the stability, an alloy including such a metal may be used as the above electrode material.

In this embodiment, to extract luminescence from the anode electrode side, the anode electrode 22 is configured as the transparent ITO electrode. With respect to such an anode electrode 22, to effectively inject positive holes thereto, the anode electrode 22 may be made from a metal material having a large work function from the vacuum level, such as Au, Sn, $(O_2+Sb)$, or $(ZnO+Al)$.

To enhance the stability of the device, as shown by a virtual line of FIG. 8, the device may be sealed with a protective layer made from germanium oxide for preventing the device from being affected from oxygen in atmospheric air. Of course, the device may be driven in an evacuated state.

The size of the base is not limited. For example, a large sized base can be obtained by sticking the end surface of a substrate having a size of about 2 inches to the base by means of frit glass.

The present invention will be more fully understood with reference to the following examples:

Examples 1 to 4 prepared by different combinations of materials used and surface roughnesses in accordance with the preferred embodiment of the present invention are compared in luminance and luminous efficiency with Comparative Examples 1 to 3 prepared by different combinations of materials used and surface roughnesses not in accordance with the preferred embodiment.

EXAMPLE 1

An aggregation of quartz glass fibers was cut to prepare a substrate 21, shown in FIG. 1, having a thickness "t" of 1.0 mm, a length "l" of 30 mm, and a width "w" of 30 mm. The surface of the substrate 21 was polished, and entirely coated with frit glass. Then, the surface of the frit glass sheet thus formed was polished such that the average surface roughness measured by a contact type roughness meter became about 30 nm.

Figure 9:
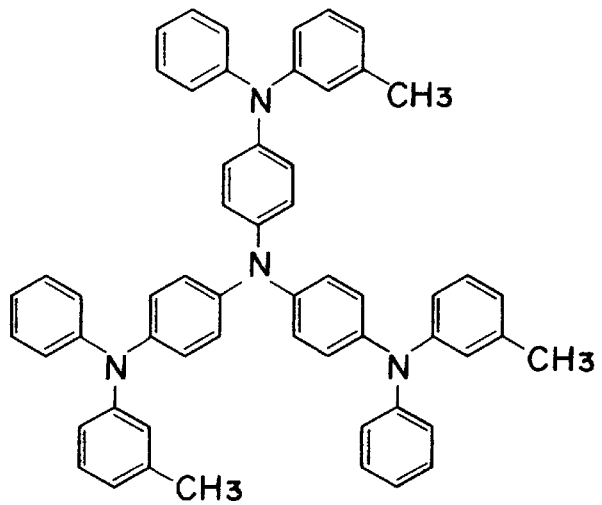
FIG. 9 is a structural formula of m-MTDATA used for the organic EL device.

An ITO electrode 22 (thickness: about 100 nm) was formed on the substrate 21 by sputtering, and a mask made from $SiO_2$ and having openings corresponding to luminescence regions each having a size of 2 mm×2 mm was formed on the ITO electrode 22 by vapor-deposition, to prepare the masked ITO substrate 21 for producing an organic EL device. Then, a positive hole injection layer 23 made from m-MTDATA (4,4',4"-tris[3-methylphenylphenylamino]triphenylamine) having a structural formula shown in FIG. 9 was formed on the masked ITO substrate 21 to a thickness of 50 nm by vacuum vapor-deposition.

Figure 10:
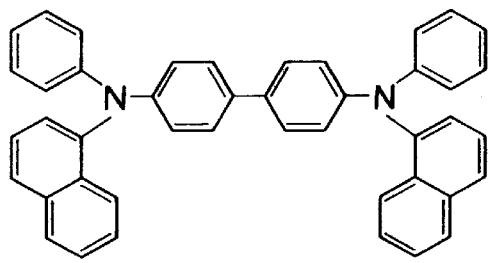
FIG. 10 is a structural formula of α-NPD used for the organic EL device.
Figure 11:
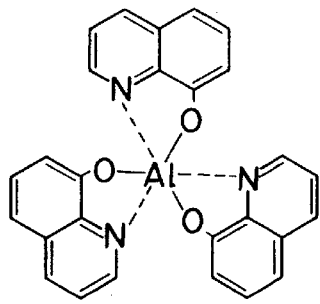
FIG. 11 is a structural formula of $Alq_3$ used for the organic EL device.

A positive hole transfer layer 24 made from α-NPD (4,4'-bis[N-(1-naphthyl)-N-phenyl-amino]biphenyl) having a structural formula shown in FIG. 10 was formed on the positive hole injection layer 23 to a thickness of 50 nm by vacuum vapor-deposition, and an electron transfer luminescence layer 26 made from $Alq_3$ (8-hydroxyquinorine aluminum) having a structural formula shown in FIG. 11 was formed to a thickness of 50 nm on the positive hole transfer layer 24 by vacuum vapor-deposition. Finally, a cathode electrode 27 having a laminated structure of LiF (lithium-fluorine alloy) and Al was formed on the electron transfer luminescence layer 26. An organic EL device for generating single hetero type green color luminescence was thus produced.

As a result of driving the organic EL device thus produced by applying a DC voltage thereto, the maximum luminance was 20,000 cd/m$^2$ at 9.0 V, and the luminous efficiency was 2.21 m/W at 200 cd/m$^2$.

EXAMPLE 2

An aggregation of polymer fibers was cut to prepare a substrate 21, shown in FIG. 1, having a thickness "t" of 1.0 mm, a length "l" of 30 mm, and a width "w" of 30 mm. The surface of the substrate 21 was polished, and entirely coated with frit glass. Then, the surface of the frit glass sheet thus formed was polished such that the average surface roughness measured by the contact type roughness meter became about 30 nm.

An ITO electrode 22 (thickness: about 100 nm) was formed on the substrate 21 by sputtering, and a mask made from SiO$_2$ and having openings corresponding to luminescence regions each having a size of 2 mm×2 mm was formed on the ITO electrode 22 by vapor-deposition, to prepare the masked ITO substrate 21 for producing an organic EL device. Then, a positive hole injection layer 23 made from m-MTDATA (4,4',4"-tris[3-methylphenylphenylamino] triphenylamine) having the structural formula shown in FIG. 9 was formed on the masked ITO substrate 21 to a thickness of 50 nm by vacuum vapor-deposition.

A positive hole transfer layer 24 made from α-NPD (4,4'-bis[N-(1-naphthyl)-N-phenyl-amino]biphenyl) having the structural formula shown in FIG. 10 was formed on the positive hole injection layer 23 to a thickness of 50 nm by vacuum vapor-deposition, and an electron transfer luminescence layer 26 made from Alq$_3$ (8-hydroxyquinorine aluminum) having the structural formula shown in FIG. 11 was formed to a thickness of 50 nm on the positive hole transfer layer 24 by vacuum vapor-deposition. Finally, a cathode electrode 27 having a laminated structure of LiF and Al was formed on the electron transfer luminescence layer 26. An organic EL device for generating single hetero type green color luminescence was thus produced.

As a result of driving the organic EL device thus produced by applying a DC voltage thereto, the maximum luminance was 21,000 cd/m$^2$ at 9.0 V, and the luminous efficiency was 2.31 m/W at 200 cd/m$^2$.

EXAMPLE 3

An aggregation of polymer fibers was cut to prepare a substrate 21, shown in FIG. 1, having a thickness "t" of 0.5 mm, a length "l" of 30 mm, and a width "w" of 30 mm. The surface of the substrate 21 was polished, and entirely coated with an ultraviolet curing resin generally used for adhesive bonding of an optical lens. A glass sheet for liquid crystal, having a thickness of 0.5 mm, was placed on the ultraviolet curing resin layer and adhesively bonded thereto by ultraviolet curing. Then, the surface of the glass sheet thus bonded was polished such that the average surface roughness measured by the contact type roughness meter became about 20 nm.

An ITO electrode 22 (thickness: about 100 nm) was formed on the substrate 21 by sputtering, and a mask made from SiO$_2$ and having openings corresponding to luminescence regions each having a size of 2 mm×2 mm was formed on the ITO electrode 22 by vapor-deposition, to prepare the masked ITO substrate 21 for producing an organic EL device. Then, a positive hole injection layer 23 made from m-MTDATA (4,4',4"-tris[3-methylphenylphenylamino] triphenylamine) having the structural formula shown in FIG. 9 was formed on the masked ITO substrate 21 to a thickness of 50 nm by vacuum vapor-deposition.

A positive hole transfer layer 24 made from α-NPD (4,4'-bis[N-(1-naphthyl)-N-phenyl-amino]biphenyl) having the structural formula shown in FIG. 10 was formed on the positive hole injection layer 23 to a thickness of 50 nm by vacuum vapor-deposition, and an electron transfer luminescence layer 26 made from Alq$_3$ (8-hydroxyquinorine aluminum) having the structural formula shown in FIG. 11 was formed to a thickness of 50 nm on the positive hole transfer layer 24 by vacuum vapor-deposition. Finally, a cathode electrode 27 having a laminated structure of LiF and Al was formed on the electron transfer luminescence layer 26. An organic EL device for generating single hetero type green color luminescence was thus produced.

As a result of driving the organic EL device thus produced by applying a DC voltage thereto, the maximum luminance was 24,000 cd/m$^2$ at 9.0 V, and the luminous efficiency was 2.51 m/W at 200 cd/m$^2$.

EXAMPLE 4

An aggregation of polymer fibers was cut to prepare a substrate 21, shown in FIG. 1, having a thickness "t" of 0.5 mm, a length "l" of 30 mm, and a width "w" of 30 mm. The surface of the substrate 21 was polished, and entirely coated with an ultraviolet curing resin generally used for adhesive bonding of an optical lens. A glass sheet for liquid crystal, having a thickness of 0.5 mm, was placed on the ultraviolet curing resin layer and adhesively bonded thereto by ultraviolet curing. Then, the surface of the glass sheet thus bonded was polished such that the average surface roughness measured by the contact type roughness meter became about 20 nm.

An ITO electrode 22 (thickness: about 100 nm) was formed on the substrate 21 by sputtering, and an inorganic EL layer including CaGa$_2$S$_4$:Ce as phosphor at the luminescence center was formed on the ITO electrode 22, to produce an inorganic EL device.

As a result of driving the inorganic EL device thus produced at 60 Hz, the maximum luminance was 15 cd/m$^2$.

COMPARATIVE EXAMPLE 1

An organic EL device was produced by using a glass substrate (thickness: 1.0 mm) for 2-inch liquid crystal in place of the substrate composed of optical fibers used in Example 1. The surface of the glass substrate was polished such that the average surface roughness measured by the contact type roughness meter became about 30 nm.

An ITO electrode 22 (thickness: about 100 nm) was formed on the glass substrate by sputtering, and like Example 1, a mask made from SiO$_2$ and having openings corresponding to luminescence regions each having a size of 2 mm×2 mm was formed on the ITO electrode 22 by vapor-deposition, to prepare the masked ITO substrate for producing an organic EL device. Then, a positive hole injection layer 23 made from m-MTDATA (4,4',4"-tris[3-methylphenylphenylamino]triphenylamine) having the structural formula shown in FIG. 9 was formed on the masked ITO substrate to a thickness of 50 nm by vacuum vapor-deposition.

A positive hole transfer layer 24 made from α-NPD (4,4'-bis[N-(1-naphthyl)-N-phenyl-amino]biphenyl) having the structural formula shown in FIG. 10 was formed on the positive hole injection layer 23 to a thickness of 50 nm by vacuum vapor-deposition, and an electron transfer luminescence layer 26 made from $Alq_3$ (8-hydroxyquinorine aluminum) having the structural formula shown in FIG. 11 was formed to a thickness of 50 nm on the positive hole transfer layer 24 by vacuum vapor-deposition. Finally, a cathode electrode 27 having a laminated structure of LiF and Al was formed on the electron transfer luminescence layer 26. An organic EL device for generating single hetero type green color luminescence was thus produced.

As a result of driving the organic EL device thus produced by applying a DC voltage thereto, the maximum luminance was 16,500 $cd/m^2$ at 9.0 V, and the luminous efficiency was 2.01 m/W at 200 $cd/m^2$. It becomes apparent that the values and the rising gradient of luminance in a low luminance region, that is, in a low voltage drive region in Comparative Example 1 are lower than those in Example 1. In other words, the device in Example 1 extracts light to the external more efficiently than the device in Comparative Example 1 does (this will be more fully described later).

COMPARATIVE EXAMPLE 2

Like Example 2, an aggregation of polymer fibers was cut to prepare a substrate 21 as shown in FIG. 1, having a thickness "t" of 1.0 mm, a length "l" of 30 mm, and a width "w" of 30 mm. The surface of the substrate 21 was polished. In this example, the surface of the substrate 21 was not coated with frit glass. Then, the surface of the substrate 21 was polished such that the average surface roughness measured by the contact type roughness meter became about 400 nm.

An ITO electrode 22 (thickness: about 100 nm) was formed on the substrate 21 by sputtering, and a mask made from $SiO_2$ and having openings corresponding to luminescence regions each having a size of 2 mm×2 mm was formed on the ITO electrode 22 by vapor-deposition, to prepare the masked ITO substrate 21 for producing an organic EL device. Then, a positive hole injection layer 23 made from m-MTDATA (4,4',4"-tris[3-methylphenylphenylamino]triphenylamine) having the structural formula shown in FIG. 9 was formed on the masked ITO substrate 21 to a thickness of 50 nm by vacuum vapor-deposition.

A positive hole transfer layer 24 made from α-NPD (4,4'-bis[N-(1-naphthyl)-N-phenyl-amino]biphenyl) having the structural formula shown in FIG. 10 was formed on the positive hole injection layer 23 to a thickness of 50 nm by vacuum vapor-deposition, and an electron transfer luminescence layer 26 made from $Alq_3$ (8-hydroxyquinorine aluminum) having the structural formula shown in FIG. 11 was formed to a thickness of 50 nm on the positive hole transfer layer 24 by vacuum vapor-deposition. Finally, a cathode electrode 27 having a laminated structure of LiF and Al was formed on the electron transfer luminescence layer 26. An organic EL device for generating single hetero type green color luminescence was thus produced.

As a result of driving the organic EL device thus produced, it was found that dark spots exist over the luminescent plane to such an extent as not to allow practical use of the device. The reason for this may be presumed that since the surface roughness of the cut plane of the substrate composed of the aggregation of polymer fibers is large, the surface roughness of the ITO transparent electrode formed on the substrate becomes large. The average surface roughness of the outermost surface, measured by using the contact type roughness meter, was about 200 nm.

COMPARATIVE EXAMPLE 3

Like Comparative Example 1, a glass substrate for a liquid crystal having a thickness of 1.1 mm was used, and the surface of the substrate was polished such that the average surface roughness measured by the contact type roughness meter became about 20 nm.

An ITO electrode 22 (thickness: about 100 nm) was formed on the substrate by sputtering, and an inorganic EL layer including $CaGa_2S_4$:Ce as phosphor at the luminescence center was formed on the ITO electrode 22, thus produced an inorganic EL device similar to that in Example 4.

As a result of driving the inorganic EL device thus produced at 60 Hz, the maximum luminance was 8 $cd/m^2$ which was lower than that in Example 4. It becomes apparent that the inorganic EL device in Example 4 extracts light to the external more efficiently than the device in Comparative Example 3 does.

Figure 12:
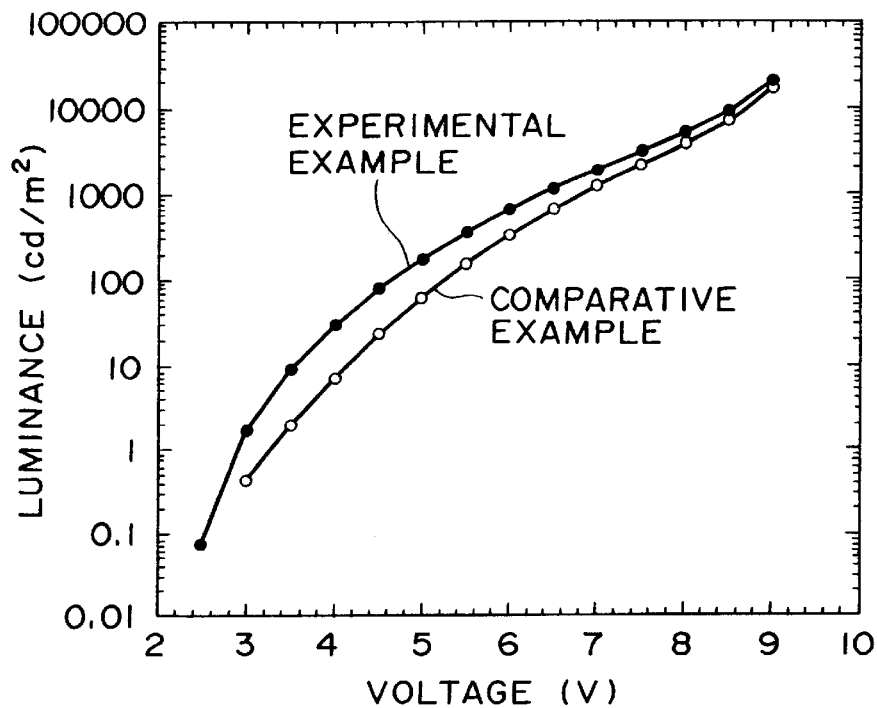
FIG. 12 is a graph showing the characteristic of the organic EL device in this embodiment as compared with that of the related art organic EL device.

FIG. 12 is a graph showing data on luminance and luminous efficiency of the organic EL devices obtained in Example 1 and Comparative Example 1.

As shown in FIG. 12, the device in Example 1 in which the aggregation of fibers is used as the substrate according to the present invention is larger in luminance particularly in a low voltage drive region than the device in Comparative Example 1 in which glass is used as the substrate. This shows that the substrate composed of the optical fibers according to the present invention can efficiently extract luminescence generated in the luminescence region of the device to the external.

As described above, a substrate for an organic EL device according to this embodiment is prepared by cutting an aggregation of optical fibers in the direction crossing the fiber length direction, wherein the optical fibers are arranged at specific intervals in the in-plane direction of the substrate and the substrate plane on the device formation side is finished into a surface roughness of 300 nm or less. Accordingly, luminescence generated in the device is incident on the substrate without occurrence of irregular reflection from the interface between the device and the substrate, and is allowed to pass through the substrate while being efficiently guided at the refractive index of the optical fibers constituting the substrate. As a result, the efficiency of extracting light from each pixel to the external through the substrate is significantly improved as compared with the related art glass substrate, and therefore, the device formed on the substrate exhibits a desirable luminance even at a low voltage. To be more specific, the luminance obtained by the device formed on the substrate of the optical fibers in this embodiment is several times as large as that obtained by the device formed on the related art glass substrate.

The above-described embodiment may be varied on the basis of the basic thought of the present invention.

For example, the pattern, shape and structure, arrangement state, and material of the aggregation of optical fibers, and the size of the substrate formed by the aggregation of the optical fibers may be varied from those described in the above embodiment. The frit glass or ultraviolet curing resin generally used for adhesively bonding an optical lens, described in the above embodiment, may be replaced with another coating material insofar as it exhibits the same performance.

Figure 4:
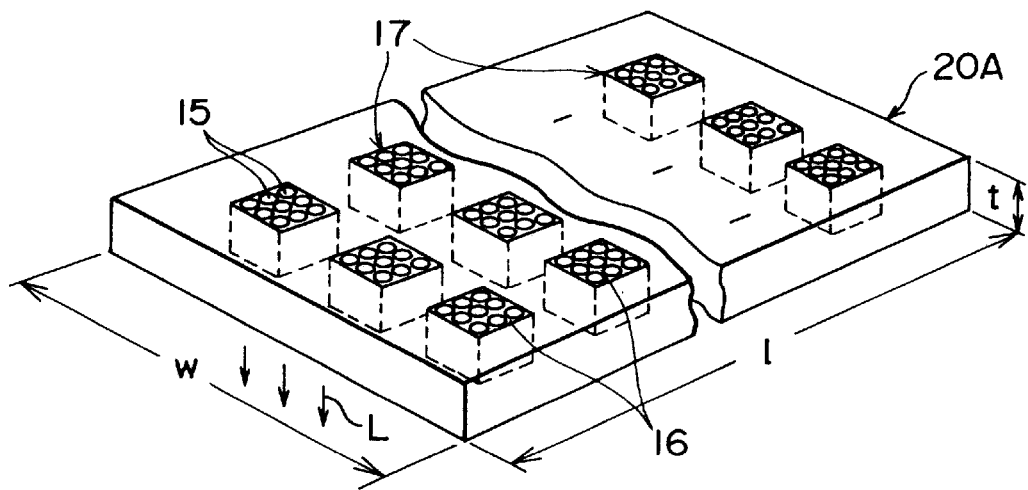
FIG. 4 is a schematic perspective view of one variation of the base.

In accordance with one variation, each pixel formation region 17 of the glass substrate 20A shown in FIG. 4 is formed into a square or circular shape, and the aggregation of the fibers 15 may be provided on the pixel formation region 17 like the embodiment.

Figure 6B:
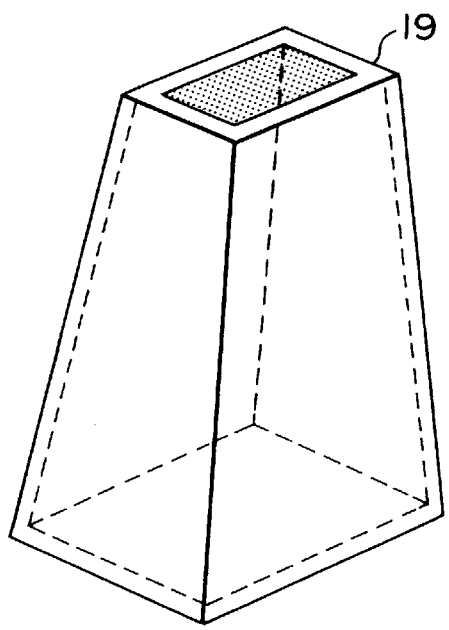
FIG. 6B is a perspective view showing another variation of the fiber configuration, in which a square truncated fiber is provided in each pixel region.

The circular truncated fiber 18 or square truncated fiber 19 may be provided at each pixel formation region 17 of the glass substrate 20B as shown in FIGS. 5 and 6, or a plurality of the circular truncated fibers 19 may be provided at each pixel formation region 17 of the glass substrate 20B as shown in FIG. 7.

The substrate in this embodiment may be used not only for the EL device but also for other optical devices such as an LCD (Liquid Crystal Display).

While a preferred embodiment of the present invention has been described using specific terms, such description is for illustrative purpose only, and it is to be understood that changes and variations may be made without departing from the spirit or scope of the following claims.

What is claimed is:

1. An optical device comprising:

a light transmittable base; and a device constituent layer provided on said base; wherein said base includes, at least in a pixel formation region, continuously extending layers arranged to exhibit a cyclic refractive index distribution in the in-plane direction and to exhibit a specific refractive index in the thickness direction;

wherein said base, on the device constituent layer side, has a surface roughness of 300 nm or less;

wherein said base comprises a plurality of pixel formation regions, each having an aggregation of truncated optical fibers arranged in such a manner as to extend along the thickness direction of said base; each truncated optical fiber in said aggregation of truncated optical fibers having a first end surface and a second end surface on opposing ends of the optical fiber; said first end surface having a greater area than said second end surface;

wherein a center-to-center distance between adjacent first end surfaces is greater than a center-to-center distance between adjacent second end surfaces.

2. An optical device according claim 1, wherein said optical fibers comprise quartz glass fibers or polymer fibers.

3. An optical device according to claim 1, wherein said base is formed by cutting said aggregation of said optical fibers in the direction crossing the fiber length direction.

4. An optical device according to claim 3, wherein the in-plane of said base having been formed by cutting said aggregation of said optical fibers is entirely covered with an organic material or inorganic material, and the surface of said base is finished exhibiting a surface roughness of 300 nm or less.

5. An optical device according to claim 4, wherein the surface of said base having been formed by cutting said aggregation of said optical fibers is polished, and the surface of said organic material or inorganic material formed to cover the polished surface of said base is further polished.

6. An optical device according to claim 4, wherein said organic material comprises an ultraviolet curing resin generally used for adhesive bonding of an optical lens.

7. An optical device according to claim 4, wherein said inorganic material comprises frit glass.

8. An optical device according to claim 1, wherein a laminated body of organic layers including a luminescence region is formed on said base.

9. An optical device according to claim 8, wherein an optical transparent electrode, an organic hole transfer layer, an organic luminescence layer and/or an organic electron transfer layer, and a metal electrode are sequentially laminated on said base.

10. An optical device according to claim 8, wherein said optical device is configured as an organic electroluminescence device.

11. A base for an optical device, which is light transmittable and on which an optical device constituent layer is provided, said base comprising:

continuously extending layers arranged to exhibit a cyclic refractive index distribution in the in-plane direction and to exhibit a specific refractive index in the thickness direction;

wherein the surface roughness of said base on said device constituent layer side is 300 nm or less;

wherein said base comprises a plurality of pixel formation regions, each having an aggregation of truncated optical fibers arranged in such a manner as to extend along the thickness direction of said base; each truncated optical fiber in said aggregation of truncated optical fibers having a first end surface and a second end surface on opposing ends of the optical fiber; said first end surface having a greater area than said second end surface;

wherein a center-to-center distance between adjacent first end surfaces is greater than a center-to-center distance between adjacent second end surfaces.

12. A base for an optical device according to claim 11, wherein said optical fibers comprise quartz glass fibers or polymer fibers.

13. A base for an optical device according to claim 11, wherein said base is formed by cutting said aggregation of said optical fibers in the direction crossing the fiber length direction.

14. A base for an optical device according to claim 13, wherein the in-plane of said base having been formed by cutting said aggregation of said optical fibers is entirely covered with an organic material or inorganic material, and the surface of said base is finished into a surface roughness of 300 nm or less.

15. A base for an optical device according to claim 14, wherein the surface of said base having been formed by cutting said aggregation of said optical fibers is polished, and the surface of said organic material or inorganic material formed to cover the polished surface of said base is further polished.

16. A base for an optical device according to claim 14, wherein said organic material comprises an ultraviolet curing resin generally used for adhesive bonding of an optical lens.

17. A base for an optical device according to claim 14, wherein said inorganic material comprises frit glass.

18. A base for an optical device according to claim 11, wherein a laminated body of organic material layers including a luminescence region is formed on said base.

19. A base for an optical device according to claim 18, wherein an optical transparent electrode, an organic hole transfer layer, an organic luminescence layer and/or an organic electron transfer layer, and a metal electrode are sequentially laminated on said base.

20. A base for an optical device according to claim 18, wherein said base is configured as an organic electroluminescence device.

* * * * *